United States Patent
Edmonston et al.

(10) Patent No.: US 6,775,800 B2
(45) Date of Patent: Aug. 10, 2004

(54) SYSTEM AND METHOD FOR HIGH SPEED PROCESSING OF TURBO CODES

(75) Inventors: Brian S. Edmonston, Poway, CA (US); Paul K. Gray, San Diego, CA (US)

(73) Assignee: iCoding Technology, Inc., San Diego, CA (US)

( * ) Notice: Subject to any disclaimer, the term of this patent is extended or adjusted under 35 U.S.C. 154(b) by 317 days.

(21) Appl. No.: 09/742,248

(22) Filed: Dec. 20, 2000

(65) Prior Publication Data

US 2002/0029364 A1 Mar. 7, 2002

Related U.S. Application Data (60) Provisional application No. 60/174,298, filed on Jan. 3, 2000, and provisional application No. 60/174,290, filed on Jan. 3, 2000.

(51) Int. Cl.[7] .................. H03M 13/27; H03M 13/29
(52) U.S. Cl. ............................................ 714/755
(58) Field of Search ..................... 714/701, 755, 714/761, 762, 780, 786

(56) References Cited

U.S. PATENT DOCUMENTS

| | | | | |
|---|---|---|---|---|
| 5,136,588 A | * | 8/1992 | Ishijima | 714/701 |
| 5,293,607 A | * | 3/1994 | Brockmann et al. | 711/5 |
| 5,377,340 A | * | 12/1994 | Seroussi et al. | 711/5 |
| 5,530,837 A | * | 6/1996 | Williams et al. | 711/157 |
| 5,535,220 A | * | 7/1996 | Kanno et al. | 714/701 |
| 5,652,861 A | * | 7/1997 | Mayo et al. | 711/157 |
| 5,671,392 A | * | 9/1997 | Parris et al. | 711/148 |
| 5,924,111 A | * | 7/1999 | Huang et al. | 711/5 |
| 6,381,728 B1 | * | 4/2002 | Kang | 714/781 |
| 6,434,203 B1 | * | 8/2002 | Halter | 375/341 |

FOREIGN PATENT DOCUMENTS

EP 1030455 A2 * 8/2000

* cited by examiner

*Primary Examiner*—Stephen M. Baker
(74) *Attorney, Agent, or Firm*—Gazdzinski & Associates (57) ABSTRACT

A system and method for high efficiency, high performance processing of turbo codes is described. In accordance with one embodiment of the invention, an interleaver for interleaving code symbols is providing, the interleaver having a plurality of subsections, each subsection having a set of addresses and each address having an index, wherein a substantially constant relationship exists from any one subsection to any other subsection between the index of each address at a particular location.

24 Claims, 7 Drawing Sheets

SYSTEM AND METHOD FOR HIGH SPEED PROCESSING OF TURBO CODES

CROSS-REFERENCE TO RELATED APPLICATIONS

This application claims the benefit of 35 U.S.C. § 120 and claims priority to now abandoned U.S. application Ser. No. 60/174,298 filed Jan. 3, 2000 entitled "ITERATIVE DECODING ARCHITECTURE"; U.S. application Ser. No. 60/174,290 entitled "SYSTEM AND METHOD FOR EFFICIENT PARALLEL PROCESSING OF TURBO CODES" filed Jan. 3, 2000, all assigned to the assignee of the present invention.

FIELD

The present invention is related to the field of communications. More particularly, the present invention is a system and method for high efficiency, high performance parallel processing of turbo codes.

BACKGROUND

Turbo coding is a recently developed forward error correction coding and decoding technique that provides previously unavailable error correction performance. A general description of a parallel turbo code can be found in U.S. Pat. No. 5,446,747 entitled "Error-correction Coding Method With at Least Two Systematic Convolution Codings in Parallel, Corresponding Iterative Decoding Method, Decoding Module and Decoder," filed Apr. 16, 1992 assigned to France Telecom and incorporated herein by reference. The enhanced level of error correction provided by turbo codes facilitates the transmission of data over noisy channels, thereby improving the data transmission capability of all sorts of communications systems.

Some characteristics of turbo codes combine to make the associated decoders more difficult to implement in an integrated circuit. These characteristics include large frame sizes, the use of repeated decoding steps that incorporate extrinsic information, and the use of a pseudo random interleaver for generating interleaved versions of the transmitted information and extrinsic information used during encoding and decoding. Additionally, many turbo-coding schemes require a sufficiently high degree of randomness in the psuedo random interleaver such that the sequence must be stored in memory rather than calculated on the fly.

This combination of characteristics causes turbo codes to require, in general, greater processing resources than other forward error correction coding techniques. For example, the use of repeated decoding steps increases the decoding time. The (typically) large frame size combined with the use of extrinsic information during decoding increases the amount of memory required to implement a decoder.

Additionally, the use of a pseudo random interleaver complicates the ability to decode a frame in parallel because extrinsic and sample information can not be accessed in an orderly fashion. Memory requirements are further increased by the use of memory based interleavers, which are preferred when turbo codes having the best performance are required. The use of memory based interleavers can also reduce the speed of the decoder since the interleaver typically has to be accessed twice during a decoding subiteration. This limits the possible decoding speed to half the memory access rate, which is often much slower than the rate of other available circuits.

SUMMARY

The present invention is directed to providing a decoding circuit that minimizes the negative effect the above described characteristics have on performance and cost, thereby increasing the number of applications for which turbo codes may be used in a practical and economic manner. Additionally, the present invention is directed to a turbo decoder architecture that provides broadband capability using a practical amount of circuitry and memory.

DETAILED DESCRIPTION OF THE PREFERRED EMBODIMENTS

Figure 1:
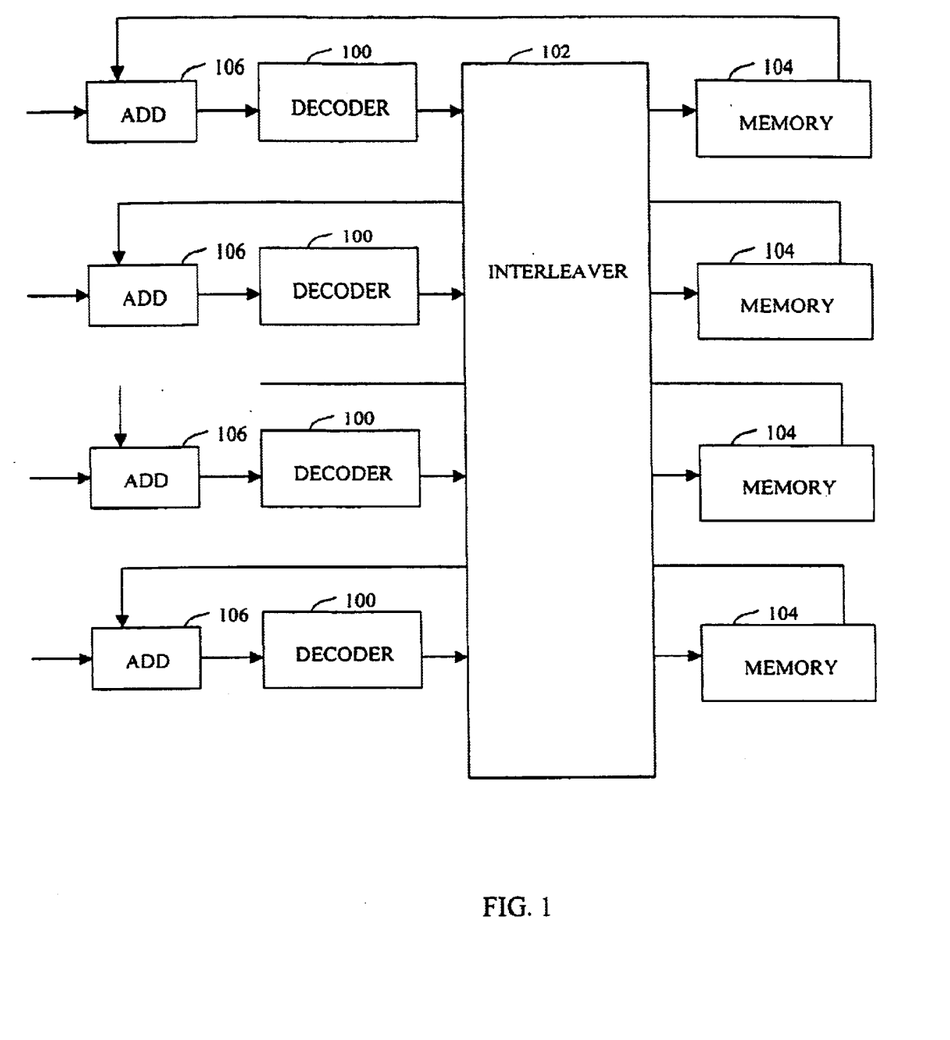
FIG. 1 is a block diagram that illustrates a fundamental operation performed when doing iterative decoding.

FIG. 1 is a block diagram that illustrates a fundamental operation performed when doing iterative decoding. During decoding, receive samples are processed through add circuits 106 and decoder circuits 100. Decoder circuits are preferably soft-in-soft-out (SISO) decoders such as MAP decoders that perform the maximum a posteriori decoding algorithm.

To speed up processing each decoder 100 processes a portion of the frame simultaneously, or in parallel. The output of the decoders is passed to an interleaver 102 (which could also be a deinterleaver). Interleaver 102 reroutes the data to a set of memory banks 104. Once all the data is processed a second iteration is performed using the receive samples as well as the data stored in memory banks 104.

The performance of the above described decoder is adversely impacted by the use of interleaver 102, however. In particular, the interleaving pattern will often require that the output of two or more decoders be written to the same memory 104. Because the memory can only receive one value at any given time, the decoder must be stalled, or the value stored, until the memory become available. This delays the speed at which decoding can be done, and reduces the benefit of using multiple decoders in parallel. Where such delay can be avoided it would be advantageous.

A system and method for high efficiency, high performance processing of turbo codes is described. In accordance with one embodiment of the invention, an interleaver for interleaving code symbols is provided, the interleaver having a plurality of subsections, each subsection having a set of addresses and each address having an index, wherein a substantially constant relationship exists, from any one subsection to any other subsection, between the index of each address at a particular location. In a second embodiment of the invention, a forward error correction decoder is provided having a plurality of memory elements, each for storing data associated with a valid index value, a plurality of decoders, each for decoding a subsection from said interleaver, and M interleaver subsections, where the M interleaver subsections each have addresses and said addresses are generated in sets of n values separated by a value SET_STEP, and wherein each subsection is comprised of r sets of n values, where r is an integer multiple of M.

Figure 2:
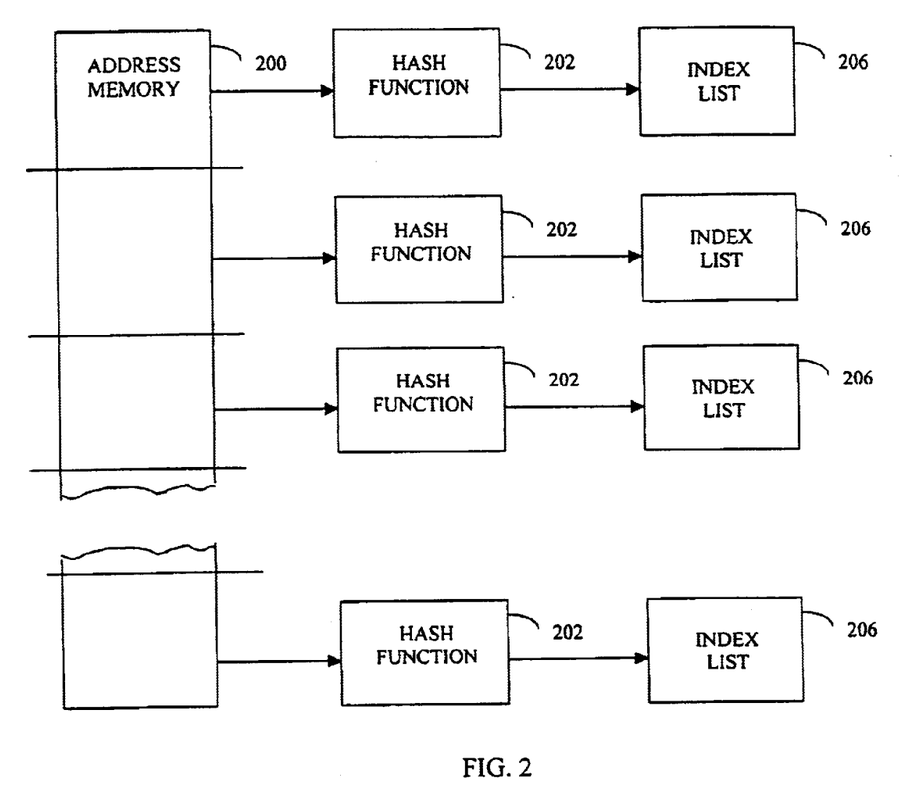
FIG. 2 is a block diagram illustrating an interleaver configured in accordance with one embodiment of the invention.

FIG. 2 is a block diagram illustrating an interleaver configured in accordance with one embodiment of the invention. Address memory 200 contains the set of addresses that define the interleaver. The interleaver address space is divided into subsections that correspond to the portions of the frame that will be decoded by a particular decoder.

The application of the hash function 202 to each subset of address produces an index list (206). In accordance with one embodiment of the invention, the interleaver addresses are selected such that the index for the set of addresses at a particular location is different for every subsection. Thus, as decoding is performed, each decoder will be writing to a different memory bank 104, and therefore no memory contention will take place. This will allow the decoder to take full advantage of the multiple MAP decoders.

Hash functions 202 receive the addresses and generate a hash index value based on the address. In one embodiment of the invention, the hash index is used to determine the particular memory to which the data value will be written. So the number of possible hash index values is preferably the same as the number of memories 104.

The application of the hash function 202 to each subset of address produces an index list (206). In accordance with one embodiment of the invention, the interleaver addresses are selected such that the index for the set of addresses at a particular location is different for every subsection. Thus, as decoding is performed, each decoder will be writing to a different memory bank 104, and therefore no memory contention will take place. This will allow the decoder to take full advantage of the multiple MAP decoders.

Various alternative address selections can be performed. For example, the addresses can be chosen simply so that the index lists for each subsection has a constant relationship between indexes at the same location. Writing to the memory banks can then be "pipelined" so that substantially all of the benefit of the multiple decoder can be realized.

In an exemplary embodiment, the hash function can merely select the four least significant bits of the address as the hash index. Thus, the addresses are chosen so that the addresses in a particular location within the subsection have a unique four least significant bits when compared to the other addresses in the other subsections. An interleaver with this characteristic can be generated simply by sorting and existing interleaver based on the index selection criteria.

If values are left over after the sort, they can be inserted at the beginning of the interleaver and another sort performed. Typically, a fully indexed interleaver with reasonable randomness can be arrived at after a reasonable number of sorts performed in this fashion.

It should be noted that some relative prime interleavers also have the characteristic of being fully indexed.

An alternative hash function is simply to divide the address by the size of the subsection. While the division operation is more computationally intensive, this organizes the memory into one large virtual memory, which facilitates reading from and writing to the memory during iterations in which interleaving is not performed.

In accordance with another embodiment of the invention, a turbo code may be efficiently decoded using various generated interleavers with excellent spreading properties. Various embodiments of these interleavers are described in now abandoned U.S. patent application No. 60/257,194 entitled "High Spread Highly Randomized Generatable Interleavers," filed Dec. 20, 2000, assigned to the assignee of the present invention and incorporated herein by reference in its entirety.

In that patent application, various generated interleavers are described, including interleavers generated by repeatedly adding an increment amount to an initial set of seed values. These interleavers provide excellent error correction performance with reduced memory requirements, and therefore are highly desirable. Thus, an embodiment of the present invention that incorporates these interleavers is highly desirable.

As noted above, many of the interleavers described in the above cited patent application are generated by repeatedly adding an increment amount to an initial set of seed values. In various different embodiments described in that patent the increment amount is referred to using different terms. For purposes of the description provided herein, the increment amount will be referred to as SET_STEP, but the applicability of the invention is not limited to those embodiments of the invention in the cited patent which also use the term SET_STEP.

Figure 3:
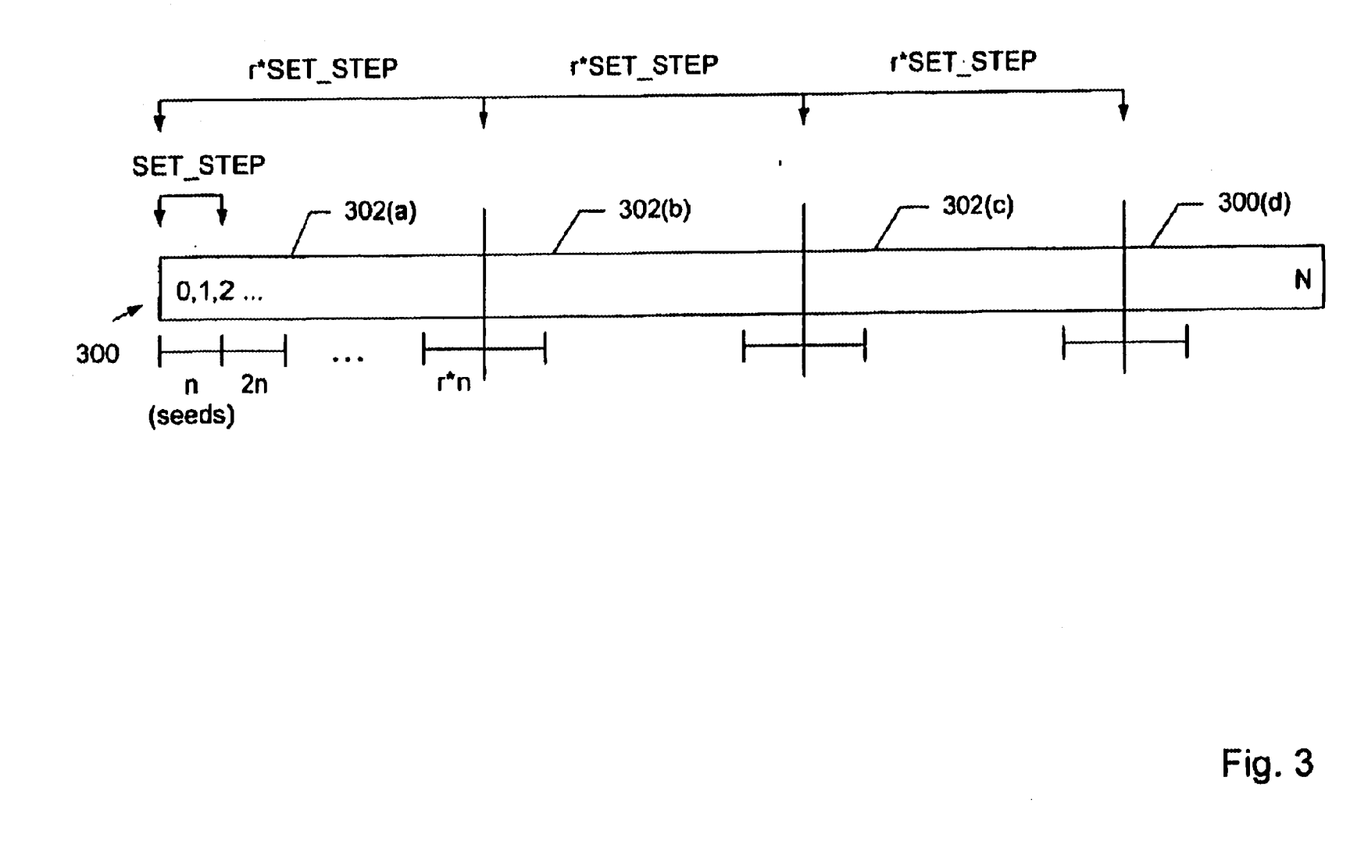
FIG. 3 is a diagram of a generated interleaver partitioned in accordance with one embodiment of the invention.

FIG. 3 is a diagram of a generated interleaver partitioned in accordance with one embodiment of the invention. The interleaver 300 contains addresses in locations 0, 1, 2 . . . N, that are used to permute data for encoding and decoding in a turbo code based forward error correction system. It should be noted, that the numbers 0, 1, 2 . . . N are merely the locations of the interleaver addresses, and not the interleaver addresses themselves.

In the described embodiment of the invention, the interleaver 300 is divided into M=4 subsection 302(*a*)–(*d*). An M value of 4 is used merely for example. Any alternative number of subsections M may be used. The four subsections preferably correspond to the number of decoding units (typically SISO decoders) that will be performing the decoding in parallel. Thus, in the described embodiment there are M interleaver subsections and M decoders operating in parallel.

Still referring to FIG. 3, the subsections 302 are further divided into windows of size n, where n is the number of seeds used to generate the interleaver. Typically, the first set of values in the interleaver are the seeds, which is denoted in FIG. 3.

As described in the above referenced patent, the addresses in the interleaver are then generated by adding a value SET_STEP to the set of n previous addresses. Thus, the second set of n addresses differ from the first set of n addresses by the amount SET_STEP. For example, the (n+1)th address will differ from the $1^{st}$ address by SET_STEP, and the (n+2)th address will difference from the $2^{nd}$ address by SET_STEP as well.

As illustrated, the subsections are comprised of a set of r*n addresses, where n is the size of the seed set, and r is an integer number that is an even multiple of M (where, as described above M, the number of decoder units). Alternatively, r can be a integer value that is relative prime to M.

Since the second subsection 302(*a*) begins r sets of n addresses after the first address, and each set of n addresses is different by SET_STEP from the previous set, the difference between first address of the first subset, and the first address in the second subset 302(*b*) is r*SET_STEP.

Similarly, the difference between the second address of the first subset, and the second address in the second subset 302(b) is also r*SET_STEP.

This relationship extends between all the subsets 302. In particular, the $i^{th}$ value for any given subset, will be some multiple of r*SET_STEP from the $i^{th}$ value in another subset 302. Across all subsets, the $i^{th}$ value in any subset 302 will be some multiple q of r*SET_STEP, where q is between 1 and (M−1).

This relationship between the $i^{th}$ value of any subset 302 allows an index for a fully indexed interleaver to be established. Once the index has been established, the iterative decoding can be performed in a highly efficient parallel fashion as described herein.

In particular, by creating an index that is based on r*SET_STEP, it can be ensured that a fully parallel decoding can be performed with the performance benefit of the highly spread and generatable interleavers. This enables the implementation of turbo decoders that are high speed, high performance and high efficiency.

In accordance with one embodiment of the invention, the index is the address A is integer-divided by r*SET_STEP. A module M (% M) operation is then performed on the result, yielding the address index. That is, in one embodiment of the invention the index value is calculated as follows:

Index=trunc(A/r*SET_STEP) % M    (1)

Where A is the address, trunc( ) removes the remainder of the divide operation, and % is a modulo operation.

In many cases, selecting the proper value for r will not allow the interleaver to be divided into M equal sized subsections. In one embodiment of the invention, this is dealt with by making the last subsection 302 shorter than the previous subsections (although preferably as close to the same as possible). This will cause one decoder and memory to not be used for a portion of the decoding subiteration, but the overall reduction in efficiency will be minimal if the shorter subsection is kept close in size to the other subsection, and in all cases the reduction in efficiency will be much less than if no indexing is used at all.

It should be understood that although this indexing represents a highly efficient and easy to implement way to take advantage of the regularity of the above described interleavers, other indexing methods for these types of interleavers may be employed in accordance with the invention. In general, the method described with respect to equation (1) is more generalized than other indexing methods may be.

For example, for certain size interleavers and certain values of SET_STEP, r*SET_STEP is equal to the number of bits in the subsection 302. In this case, the index may simply be set to the address divided by the size of the subsection (an embodiment already described above in more general terms). One example of an interleaver that meets this condition is the interleaver where m=2n, and the SET_STEP size is n, and the resulting interleaver of size N can be divided evenly into M subsections.

Figure 4:
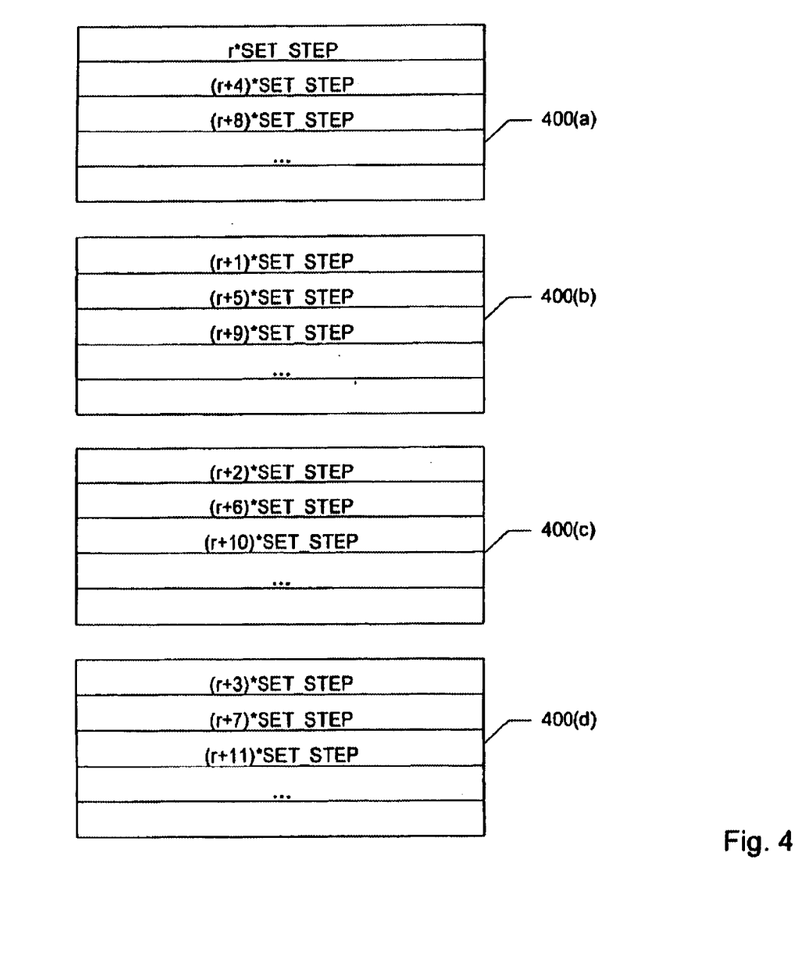
FIG. 4 is diagram illustrating the address placement within the M=4 memory banks in accordance with one embodiment of the invention.

FIG. 4 is a diagram illustrating the address placement within the M=4 memory banks in accordance with one embodiment of the invention. Four extrinsic information memories 400 are shown in accordance with the use of 4 decoders.

Within memory 400, the information is placed according to the associated address. As illustrated, memory 400(a) contains information associated with the first r*SET_STEP addresses (from address 1 to address r*SET_STEP). Memory 400(b) contains information associated with the $2^{nd}$ set of r*SET_STEP addresses, memory 400(c) contains the information associated with the $3^{rd}$ set of r*SET_STEP addresses, and memory 400(d) contains the information associated with the $4^{th}$ set of r*SET_STEP addresses.

More generally, memory 400(a) contains the information associated with (1+4p)r*SET_STEP sets of addresses, memory 400(b) contains the information associated with (2+4p)r*SET_STEP sets of addresses, memory 400(c) contains the information associated with (3+4p)r*SET_STEP sets of addresses, and memory 400(d) contains the information associated with (4+4p)r*SET_STEP sets of addresses, where p goes from 0 to the last set of r*SET_STEP of addresses within N.

More generally still, each memory contains addresses associated with a particular index value.

As should be apparent, by storing the information as shown in FIG. 4, the information necessary for the next decoding step performed by the M decoders will all be located in different memory banks since the $i^{th}$ value across all subsections will be separated from one another by the amount r*SET_STEP. Thus, the decoding can be performed completely in parallel without memory clashes.

As noted above, the calculation index calculations simplify significantly in an embodiment where the interleaver is size N n*m and m=2n, each memory simply stores the a set of N/M addresses (where M divides evenly into M). Thus the index is the address N divided by the subsection length M.

Figure 5:
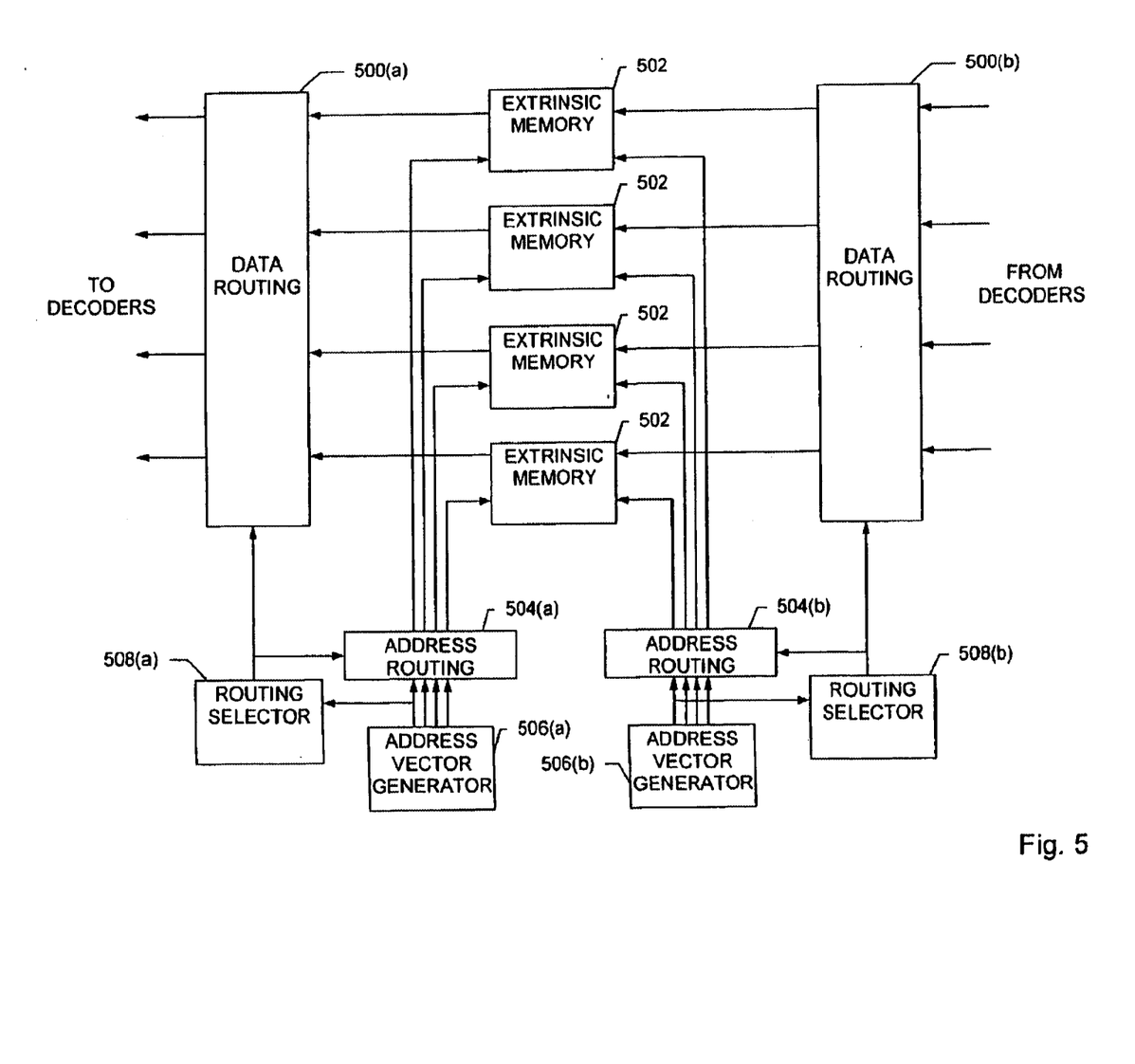
FIG. 5 is a block diagram of a portion of a turbo decoder configured in accordance with one embodiment of the present invention.

FIG. 5 is a block diagram of a portion of a turbo decoder configured in accordance with one embodiment of the present invention. As well known in turbo decoding, the extrinsic information is generated by the decoder during a first subiteration, and then that extrinsic information is reused in interleaved order by the decoder during a second subiteration.

During operation, an interleaved subiteration begins by the generation of a vector of addresses by address vector generator 506(a). Address vector generator generates M address, where M is the number of decoding units, and which in the exemplary embodiment is 4. The four addresses correspond to the $i^{th}$ address in each of the four subsections of the interleaver.

The address vector is received by address routing circuit 504(a). Additionally, one of the addresses is routed to routing selector circuit 508(a). Routing selector circuit 508(a) determines the particular index associated with the received address, and forwards that address to address routing circuit 504(a) and data routing circuit 500(a).

In the described embodiment, the index of the other subsections can be determined based on the index of any one subsection. In particular, if the index for the first one subsection is j, then the indexes for the next three subsections are (j+1) % M, (j+2) % M, and (j+3) % M. Thus, only one routing selector circuit 508(a) is necessary for each set of routing circuits. In other embodiments of the invention this property may not be present (for example when memory interleavers are being used), and one routing circuit for each address in the address vector will be necessary.

Address routing circuit 504(a) receives the address vector and the routing index, and reroutes the addresses into a new address vector based on the index. Thus, if the index is 2, the first address is routed to the second memory, and the remain addresses are rerouting based on the other index calculation described above. The addresses are received by the extrinsic memories 502, which output the corresponding data to data routing circuit 500(a).

Data routing circuit 500(a) receives the data and routes it to the decoder for which the corresponding address was generated based on the index from routing selector 508 (*a*). The resulting data vector or extrinsic information is received by the decoders (not shown) which perform decoding using the extrinsic information as well as the receive samples (not shown).

After some processing delay, the decoders generate new extrinsic information that is received by data routing circuit 500(*b*). As the new extrinsic information is received, address vector generator 506(*b*) generates the address vector for the interleaver, and the address vector is received by address routing circuit 504(*b*) and routing selector 508(*b*) receives one of the addresses.

Routing selector 508(*b*) determines the index for one address, and that index is supplied to address routing circuit 504(*b*) and data routing circuit 500(*b*). Data routing circuit 500(*b*) routes the interleaved extrinsic information generated during the decoding to the proper extrinsic memory 502, and address routing circuit 504(*b*) routes the interleaver address vector to those extrinsic memories 502 as well. The data is then written in non-interleaved order for processing during the next subiteration.

Figure 6A:
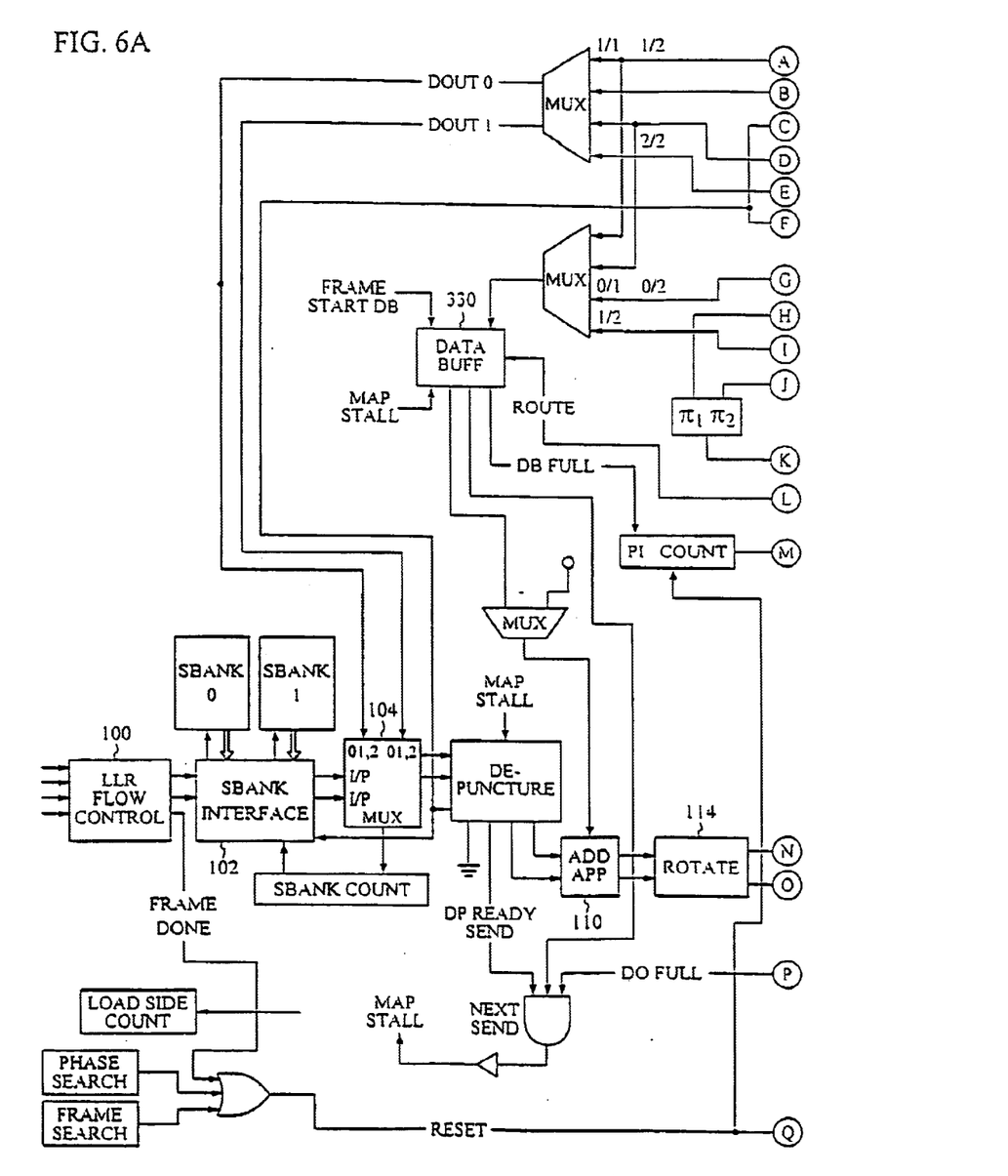
FIGS. 6A and 6B show an iterative decoder configured in accordance with an alternative embodiment of the invention in which a non-indexed interleaver is used.
Figure 6B:
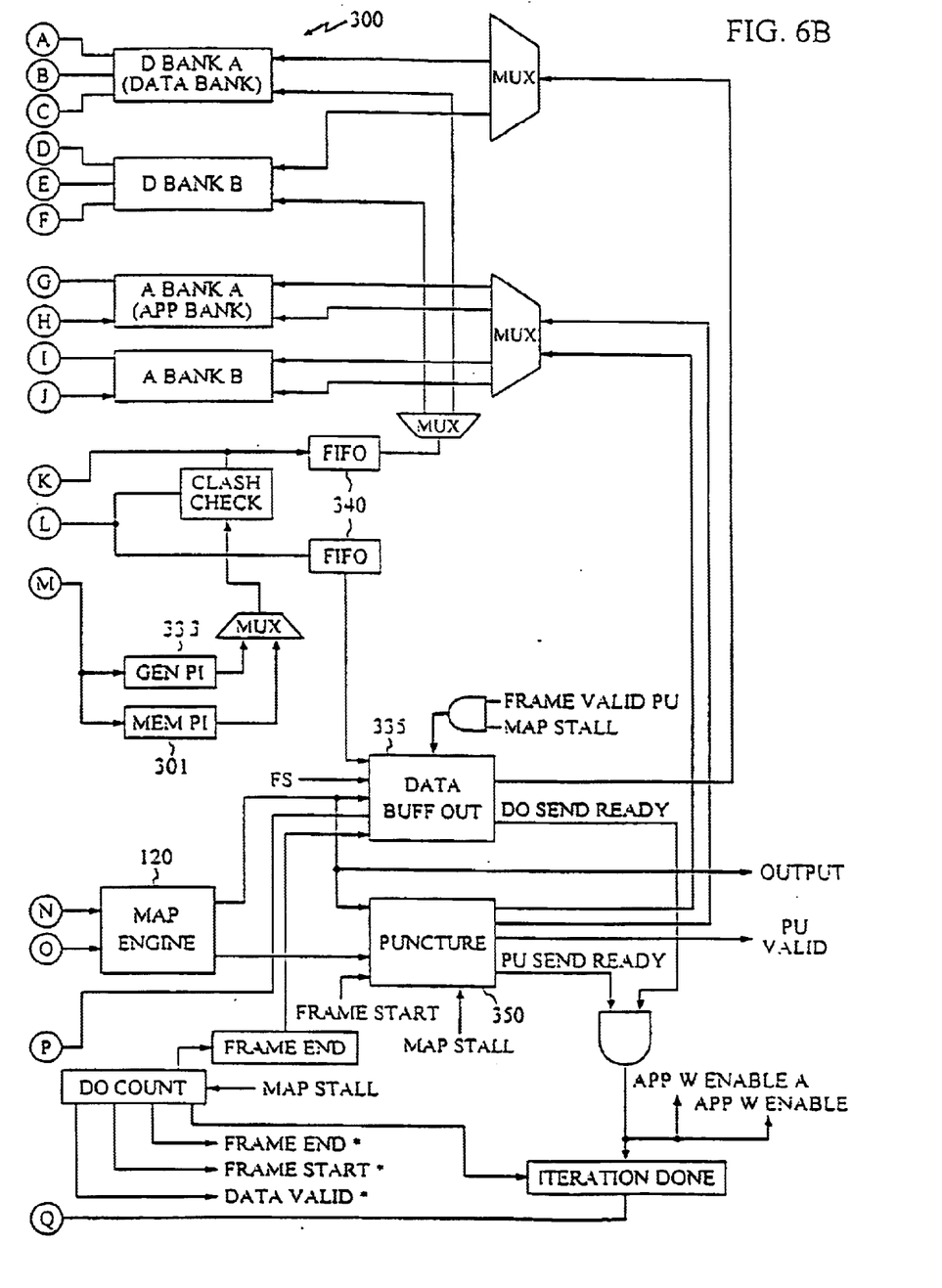

FIGS. 6A and 6B show an iterative decoder configured in accordance with an alternative embodiment of the invention in which a non-indexed interleaver is used. In some instances, a non-index interleaver may be required to meet preexisting specifications or for performance reasons.

Referring now to FIGS. 6A and 6B, receive samples are received by LLR flow control 100. LLR flow control receives samples in sets of between 1 and 4. These set correspond to different modulation scheme such as BPSK (1 sample per set) QPSK (2 samples per set), 8 PSK (3 sample per set) and 16 QAM (4 samples per set). LLR flow control writes out samples in pairs to sample bank (sbank) interface 102.

The Sbank interface simultaneously writes in sample pairs to one of the sample memory banks (sbank0 and sbank1) while reading out sixteen sets of sample pairs from the other sample memory bank.

Multiplexer 104 receives the sixteen sets of sample pairs from sbank interface 102 and also receives sixteen sets of soft decision data from APP memory 300. During a first mode, multiplexer 104 supplies the sample bank data to depuncture circuit 108 and during a second mode multiplexer 102 supplies the soft decision data to depuncture circuit 108. The first mode is preferably parallel concatenated convolutional (PCCC) mode (as well as the outer code for serial concatenated convolutional (SCCC) mode) and the second mode is for inner codes of serial concatenated convolutional mode.

Depuncture circuit 108 inserts puncture values according to a puncture pattern and add_app 110 receives the depunctured values from depuncture circuit 108 as well as extrinsic information from extrinsic memories 300. During the first iteration of SCCC decoding, the extrinsic information is not supplied during the inner code processing. Also, the outer most code of SCCC processing does not use extrinsic information. For iterations greater than one, PCCC decoding and the inner code of SCCC decoding use extrinsic information. Additionally, the middle codes of 3 code SCCC also use extrinsic information for iterations greater than one.

In an exemplary embodiment, the samples stored in the sbank memories and the extrinsic memories are divided into 16 subsections. The subsection are preferably divided in the order received, so that each subsection is approximately one sixteenth of the frame being decoded, and the second subsection follows the first and the third follows the second, etc.

Each subsection of the sample bank memory is decoded by a MAP decoder within MAP engine 120. A MAP decoder is a decoder that performs the maximum a posteriori decoding algorithm. During a warm up period, the last portion of the previous subsection is read into the particular decoder performing the decoding for that section. This is accomplished by reading out the end of each subsection from each sbank subbank and from each extrinsic subbank, and then rotating, or shifting, the output of this read using rotate circuit 114. Typically the warm up period takes 32 decoding cycles.

Once the warm up period has been competed each subsection of data is applied to a particular MAP decoder within MAP engine 120. MAP engine preferably performs decoding using a sliding window algorithm to reduce the amount of state memory necessary to perform the decoding. Additionally, MAP engine preferably contains local cache memories to store the values being decoded so that multiple passes can be made over the values in accordance with the MAP decoding algorithm.

To read out extrinsic information from extrinsic memory 300 (also called APP memory because it contains a posteriori information), a special deinterleaver circuit is used.

The interleaver addresses are generated by either a memory based interleaver (mem_pi) 301 or a generator function (gen_pi) 333. The interleaver circuits output 16 memory addresses, which correspond to the 16 MAP queues that will be performing the decoding. The interleaver addresses are received by clash check circuit 310, which determines the extrinsic memory bank in which data associated with that address is stored.

In accordance with the indexed interleaver circuit described above, the use of clash check would be eliminated and overall efficiency increased.

When multiple requests are received for the same memory bank, clash check select one request and queues up the other requests. During subsequent clock cycles multiple requests for the same memory bank are arbitrated based on the queue size from which the request originates.

Clash check generates addresses which are forwarded to the extrinsic memory, and also generates an enable vector and a routing vector, both of which are forward to data_buff_in circuit 330. The enable vector tells data_buff_in which pipeline were selected, or "won", in the arbitration process, and therefore should be read into the data buffer. The routing vector tells which extrinsic memory bank will be supplying the data to that MAP queue.

Data_buff_in assembles the data from extrinsic memory 300 into complete rows of sixteen, and forward the complete row to add app circuit 110 where they are added with the sample data or other decode data.

MAP engine 120 simultaneously decodes the sixteen subsections of the frame and outputs extrinsic as well as soft decision data. Extrinsic information is received by data_buff_out, which also receives the routing vectors and valid vectors from clash check after being delayed by FIFOs 340. Data_buff_out 335 deinterleaves the extrinsic data by routing to extrinsic memory 300 according to the routing and enable vectors, and by also routing the enable signals themselves according to the routing vector. Extrinsic memory 300 receives the address vector after also being delayed by a FIFO, and writes the values from data buff out based on those addresses as well as enable signals forwarded form data_buff_out. Data_buff_out is used during PCCC decoding as well as during the SCCC codes for codes other than the outer most code.

Puncture circuit 350 receives soft decision values from MAP engine 120 including systematic and parity soft decision values. Puncture circuit 350 punctures out values according to a puncture pattern, and supplies the punctured data to extrinsic memory 300. The punctured values are preferable written in the order that they are generated, and thus no deinterleaving is necessary.

Puncture circuit 350 is used for the outer codes in SCCC decoding and the values generated are used as the extrinsic information during the decoding of the more inner code.

In the exemplary embodiment shown, the extrinsic memory is comprised of four banks. These four banks are used for performing 3 constituent code SCCC decoding. In particular, for the middle code, one bank supplies soft decision data, another bank receives soft decision data, a third bank supplies extrinsic information, and the fourth bank receives extrinsic information.

Thus, a system and method for high efficiency high performance parallel processing of turbo codes has been described. Those skilled in the art will recognize various alternative embodiments of the invention. The descriptions provided herein are for purposes of example, and should not be construed as limiting the scope of the invention, which is set forth in the following claims.

What is claimed is:

1. A forward error correction encoder comprising:
    a first encoder adapted to encode information bits;
    a pseudo-random interleaver adapted to pseudo-randomly interleave code symbols from said first encoder, said interleaver having a plurality of subsections, each subsection having a set of addresses, and each address having an index, wherein a substantially constant relationship exists from any one subsection to any other subsection between the index of each address at a particular location; and
    a second encoder adapted to encode interleaved code symbols from said interleaver.

2. The encoder as set forth in claim 1, wherein said index is a subset of bits from said address.

3. The encoder as set forth in claim 1, wherein said index is said address divided by a row size.

4. A forward error correction decoding apparatus comprising:
    an interleaver configured to interleave code symbols from a first encoder, said interleaver having a plurality of subsections, each subsection having a set of addresses, and each address having an memory index, wherein a substantially constant relationship exists from any one subsection to any other subsection between the memory index of each address at a particular location;
    a plurality of memory elements, each capable of storing data associated with a valid memory index value; and
    a plurality of decoders, each capable of decoding a subsection from said interleaver.

5. The decoding apparatus as set forth in claim 4, wherein said memory index is a subset of bits from said address.

6. The decoding apparatus as set forth in claim 4, wherein said memory index is said address divided by a row size.

7. The decoding apparatus as set forth in claim 4, wherein said plurality of decoders use said data from said plurality of memory elements during decoding.

8. A forward error correction decoding apparatus comprising:
    a plurality of memory elements, each capable of storing data associated with a valid index value;
    a plurality of decoders, each capable of decoding a subsection from said interleaver; and
    M interleaver subsections, where said M interleaver subsections each have addresses and said addresses are generated in sets of n values separated by a value SET_STEP, and wherein each subsection is comprised of r sets of n values, where r is an integer multiple of M.

9. The forward error correction decoder as set forth in claim 8, where said valid index value is equal to trunc(A/r*SET_STEP) % M, and each memory element from said set of memory elements corresponds to a possible index value, and wherein data corresponding to a write address is written to a memory element associated with an index corresponding to said write address.

10. The forward error correction decoder as set forth in claim 8, where said valid index value is equal to trunc(A/r*SET_STEP) % M, and each memory element from said set of memory elements corresponds to a possible index value, and wherein data corresponding to a write address is written to a memory element associated with an index corresponding to said write address.

11. A system adapted to perform iterative decoding comprising:
    an address vector generation circuit adapted to generate a vector of M interleaver addresses;
    a routing selector circuit adapted to calculate a routing index based on an address from said address vector;
    a set of memories, each adapted to store extrinsic information for a portion of a frame being decoded;
    an address routing circuit adapted to route said address vector to said set of memories according to said routing index; and
    a data routing circuit adapted to route data from said set of memories to a set of decoders each of which decodes a portion of the frame in parallel;
    wherein the routing index for each address in said address vector is unique.

12. The system as set forth in claim 11 wherein said interleaver addresses are each a member of a subsection of an interleaver, and wherein said addresses are generated in sets of n values separated by a value SET_STEP, and wherein each subsection is comprised of r sets of n values, where r is an integer multiple of M.

13. A decoding apparatus adapted to decode parallel concatenated convolutional codes and serial concatenated convolutional codes comprising:
    a decoder adapted to perform the maximum a posteriori decoding algorithm, said decoder having a source data input and an extrinsic information input;
    a sample memory adapted to store receive samples;
    an extrinsic information memory adapted to store extrinsic information and soft decision information, said extrinsic information memory coupled to said extrinsic information input of said decoder; and
    a multiplexer adapted to couple said sample memory to said source data input in a first mode, and coupling said extrinsic information memory to said source data input in a second mode.

14. The decoding apparatus of claim 13 wherein said first mode comprises a parallel concatenated convolutional mode and inner code serial concatenated convolutional mode, and said second mode comprises an outer code serial concatenated convolutional mode.

15. A decoding apparatus for decoding parallel concatenated convolutional codes and serial concatenated convolutional codes comprising:
    a plurality of decoders adapted to perform the maximum a posteriori decoding algorithm, said decoder having a source data input and an extrinsic information input;

a plurality of sample memories adapted to store receive samples;

a plurality of extrinsic information memory adapted to store extrinsic information and soft decision information, said extrinsic information memory coupled to said extrinsic information input of said decoder; and a multiplexer adapted to couple said sample memory to said source data input in a first mode, and coupling said extrinsic information memory to said source data input in a second mode.

16. The decoding apparatus of claim 15 further comprising a rotation circuit for shifting the coupling of the plurality of decoders and plurality of sample memories during a warm up period.

17. The decoding apparatus of claim 15 further comprising a clash check circuit for arbitrating between multiple requests for data.

18. A forward error correction decoder comprising:

an interleaver for interleaving code symbols from an encoder, said interleaver having a plurality of subsections, each subsection having a set of addresses, and each address having an index, wherein a constant relationship exists, from any subsection to another subsection, between addresses at the same location;

a plurality of memory elements, each for storing data associated with a valid index value; and a plurality of subsection decoders, each for decoding a subsection from said interleaver;

wherein said index comprises a subset of bits from said address.

19. A forward error correction decoder comprising:

an interleaver for interleaving code symbols from an encoder, said interleaver having a plurality of subsections, each subsection having a set of addresses, and each address having an index, wherein a constant relationship exists, from any subsection to another subsection, between addresses at the same location;

a plurality of memory elements, each for storing data associated with a valid index value; and a plurality of subsection decoders, each for decoding a subsection from said interleaver;

wherein said index comprises said address divided by a row size.

20. A forward error correction decoder comprising:

a plurality of memory elements each for storing data associated with a valid index value, said valid index value comprising trunc(A/r*SET_STEP) % M, each of said memory elements corresponding to a possible index value, and wherein data corresponding to a write address is written to a memory element associated with an index corresponding to said write address;

a plurality of subsection decoders, each for decoding a subsection from said interleaver; and M interleaver subsections, where said M interleaver subsections each have addresses and said addresses are generated in sets of n values separated by a value SET_STEP, and wherein each subsection is comprised of r sets of n values, where r is an integer multiple of M.

21. Apparatus for performing iterative decoding comprising:

means for generating vector of M interleaver addresses;

means for calculating a routing index based on an address from said address vector;

memory means for storing extrinsic information for a portion of a frame being decoded;

means for routing said address vector to said set of memories according to said routing index; and means for routing data from said set of memories to a set of decoders each of which decodes a portion of the frame in parallel;

wherein the routing index for each address in said address vector is unique.

22. Apparatus adapted to perform iterative decoding, comprising:

circuitry adapted to generate a vector comprising M interleaver addresses;

circuitry adapted to calculate a routing index based on an address from said address vector;

memory apparatus adapted to store extrinsic information for a portion of a frame being decoded;

circuitry adapted to route said address vector to said memory apparatus according to said routing index; and circuitry adapted to route data from memory apparatus to a set of decoders which decode a portion of the frame in parallel;

wherein the routing index for each address in said address vector is unique.

23. Apparatus for decoding parallel concatenated convolutional codes and serial concatenated convolutional codes comprising:

means for performing the maximum a posteriori decoding algorithm, said means having a source data input and an extrinsic information input;

means for storing receive samples;

means for storing extrinsic information and soft decision information, said means for storing extrinsic information coupled to said extrinsic information input of said means for performing; and means for coupling said means for storing receive samples to said source data input in a first mode, and coupling said means for storing extrinsic information to said source data input in a second mode.

24. A forward error correction decoder comprising:

means for interleaving code symbols from an encoder, said means having a plurality of subsections, each subsection having a set of addresses, and each address having an index, wherein a constant relationship exists, from any subsection to another subsection, between addresses at the same location;

means for storing data associated with a valid index value; and a plurality of decoding means, each for decoding a subsection from said means for interleaving;

wherein said index comprises said address divided by a row size.

* * * * *